United States Patent [19]
Spillar et al.

[11] 3,949,366
[45] Apr. 6, 1976

[54] REMOTE CONTROL SYSTEM FOR ELECTRICAL POWER OUTLET

[76] Inventors: Frank Spillar; George Paclik, both of 3812 Wyewood Road, Mississauga, Ontario, Canada

[22] Filed: Sept. 9, 1974

[21] Appl. No.: 504,250

[30] Foreign Application Priority Data
Feb. 22, 1974 Canada.............................. 193200

[52] U.S. Cl............................ 340/171 R; 307/129
[51] Int. Cl.²..................... H04Q 1/18; H01H 35/24
[58] Field of Search................ 340/171 R, 148, 171; 307/129

[56] References Cited
UNITED STATES PATENTS

| | | | |
|---|---|---|---|
| 3,270,216 | 8/1966 | Dersch | 340/148 X |
| 3,579,187 | 5/1971 | Knott et al. | 340/148 |
| 3,586,919 | 6/1971 | Harris | 340/148 |
| 3,688,126 | 8/1972 | Klein | 340/148 |
| 3,868,639 | 2/1975 | Okada et al. | 340/148 |

*Primary Examiner*—Donald J. Yusko
*Attorney, Agent, or Firm*—Cushman, Darby & Cushman

[57] ABSTRACT

A remote switch control system of the type responsive to sound control waves suitable for use with electric appliances. The switch or receiver unit is built in a housing having a power inlet of the type of a regular electric plug so that the housing can be fixedly secured to an electric socket. The power outlet of the housing is of the type of a regular electric socket for receiving the household appliance power cord plug. Thus, the device can be used with any household appliance or the like. The circuitry of the receiver includes a flip-flop used as switch actuating means.

11 Claims, 3 Drawing Figures

REMOTE CONTROL SYSTEM FOR ELECTRICAL POWER OUTLET

The present invention relates to a remote control system of the type responsive to sound control waves of predetermined frequency. In particular, the invention relates to remotely controlled switch means suitable for almost any electric power consuming apparatus, particularly apparatus of the type adapted to be connected to a regular electrical power circuit used for household appliances or the like.

Various types of wireless remote control systems employing ultrasonic waves have already been proposed. Basically, such systems consist of a source of ultra-sound of predetermined frequency and a receiver adapted to actuate switch means in response to sound waves emitted from the above source. These systems are most commonly used in remote control of T.V. sets, with the receiver being mounted inside the T.V. set.

The presently known receivers thus form a part of a particular appliance, the appliance itself having a regular power inlet cord which is normally plugged in a socket.

It is an object of the present invention to provide a remotely controlled unit of the type suitable for use with almost any appliance adapted to be plugged into a regular household electric power circuit without the need for any modification of the structure of the appliance. It is another object of the present invention to provide a remote control receiver for the above control system, which can be put into operation with any regular household appliance without the need for any tools or modification of the appliance, which can be put into proper operation with a particular appliance by virtually any unskilled user.

According to the invention a remote control system is provided including a remote control receiver responsive to a predetermined sonic frequency, wherein the receiver is disposed inside a housing, the surface of which is provided with means suitable for being plugged in to a regular household power supply circuit to hold said housing substantially fixed with respect to said socket. The surface of said housing further comprises socket means of the type suitable for receiving a regular household appliance power cord plug. Thus, the receiver can be operatively connected with an appliance, the receiver being positioned between the appliance power inlet cord plug and its associated household power socket.

In order to meet comparatively strict standardized requirements for receivers of the above type, the receiver must be of as low weight as possible to provide for safe, fixed attachment by merely plugging the box into a power circuit without the need for any additional attaching means. The presently known receivers are unsuitable for this purpose mainly due to the fact that the switch actuating means of the receivers are comparatively heavy and comparatively unreliable. In certain electronic device, it is known to use as switch actuating means a so-called FLIP FLOP (a circuit having two stable states and remaining in one until a signal erases it to switch to the other) which meets the requirements of comparatively low weight and which at the same time is very reliable in operation. In general, the FLIP-FLOPS are superior to the presently used switch operation means as the FLIP-FLOP requires lower supply voltage, is of a smaller size and is more reliable. On the other hand, the FLIP-FLOP is actuated by a control electric pulse or clock which has to have certain characteristics, notably a very short rise and fall time of the control or clock pulse. Such a type of switch actuating control pulse cannot be obtained in the presently known remote control receivers operating in response to acoustic waves. It is therefore another object of the present invention to provide circuitry which is particularly suitable for remote control receivers of the above type.

According to this feature of the invention, a circuitry for use in sonic remote switch control system is provided, which comprises sound receiving means for conversion of sound waves into an alternating electric voltage, amplifier means for amplifying said alternating electrical voltage, amplitude limiting means operatively connected with said amplifier means, impedance transformation means connected to said amplitude limiting means, frequency selecting means for selecting a predetermined frequency of said alternating electrical voltage, switch actuating means and switch means, wherein said switch actuating means comprise the combination of voltage rectifying means, voltage level detecting means, pulse generating means, pulse wave form shaping means and a flip-flop.

The present invention will now be described in greater detail with reference to a preferred embodiment shown in the accompanying drawings. In the drawings.

Figure 1:
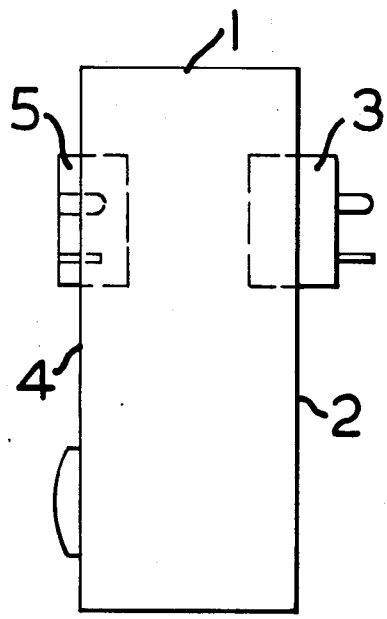
FIG. 1 is a side view of a box containing a remote control receiver circuitry.

As mentioned above, the receiver for the remote control unit according to the present invention is arranged in a box or housing (FIG. 1). The housing 1 is provided, on its rear face 2, with a plug 3 which is of regular type and is adapted to be received in a conventional socket. The front face 4 of the housing 1 includes a socket member 5 which basically corresponds to a conventional socket and is adapted to receive a regular cord plug of an appliance. It will be appreciated that the plug member 3 is fixedly secured to the housing 1 so that the entire housing 1, with the plug member 3 plugged in a wall socket (not shown), is fixedly secured to the socket, with the socket member 5 now ready to receive the plug (not shown) of an appliance cord.

Figure 2:
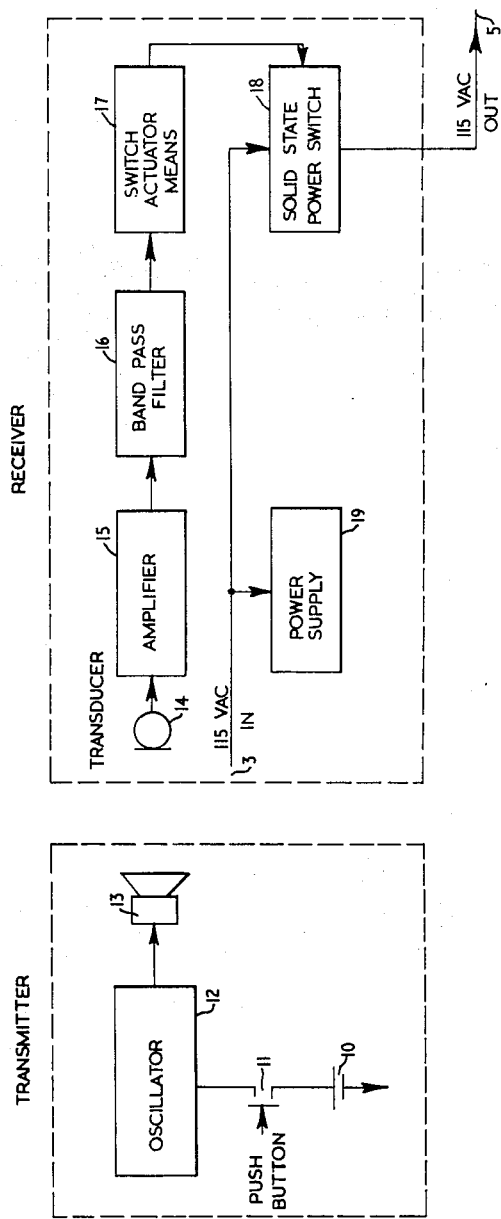
FIG. 2 is a block diagram of a remote control system.

With reference to FIG. 2, the plug member 3 is the "115 VAC IN" terminal, whereas the socket member 5 corresponds to the "115 VAC OUT" terminal. The block diagram of FIG. 2 is self-explanatory. It shows, on the left hand side, a transmitter or source of ultrasonic sound. Basically, the transmitter consists of a battery 10, a pushbutton 11, an oscillator 12 and a sound emitter 14. The transmitter unit per se is well known to those skilled in the art and is not an object of the present invention. Therefore, it does not have to be described in greater detail.

Turning now to the receiver unit (right hand side of FIG. 2), it will be seen that it comprises a transducer 14 which can also be referred to as sound receiving means for conversion of sound waves into alternating electrical voltage. The output of transducer 14 is connected to an amplifier 15, also referred to as amplifier means for amplifying said electrical voltage. The output of the amplifier 15 is connected to the input of a band pass filter means 16 the output of which is in turn connected to switch actuating means 17 which is operatively connected to a solid state power switch 18 arranged to connect or disconnect the 115 VAC line between the plug member 3 and the socket member 5. The 115 VAC line is also connected, between the plug 3 and the switch 18, to a power supply means 19 used in supplying low voltage power to the circuitry controlling the operation of the switch 18.

Figure 3:
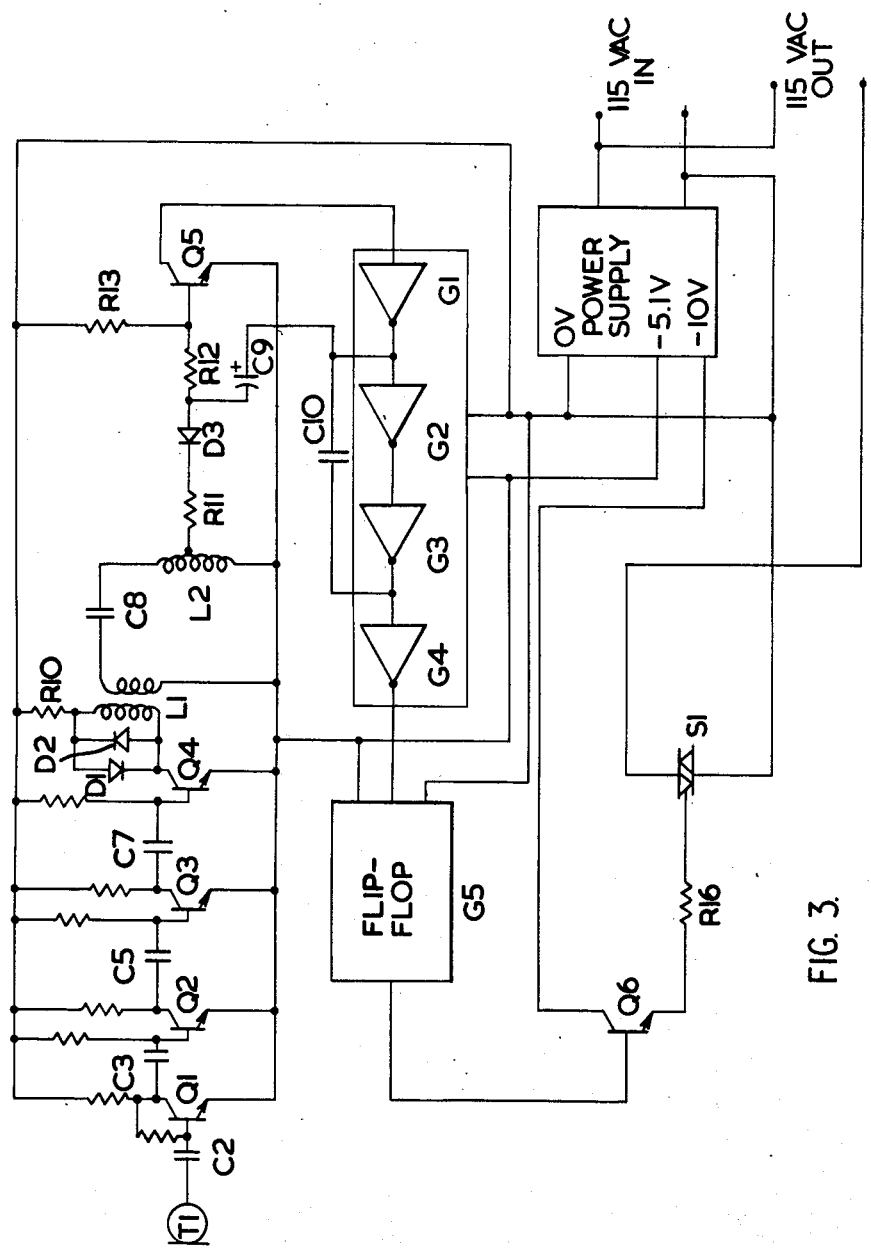
FIG. 3 is a wiring diagram of circuitry of a receiver according to the present invention.

The circuitry of the receiver and its operation will now be described in greater detail with reference to FIG. 3.

The ultra-sonic sound waves emitted by the transmitter are received by a microphone T1 and transformed into an electrical alternating signal of the same frequency as the acoustic waves. The microphone T1 thus forms an embodiment of sound receiving means for conversion of sound waves into an alternating electrical voltage.

The electrical signal coming from the microphone T1 is of an extremely small amplitude and is fed through a coupling capacitor C2 to the base electrode of transistor Q1 and is amplified. The next stage receives the signal through a coupling capacitor C3 which is connected between the collector electrode of Q1 and base electrode of Q2. The signal amplified in Q2 is further amplified in a similar way by transistors Q3 and Q4 which are associated with capacitors C5 and C7 respectively.

Collector electrode of Q4 is connected to one side of the primary winding of a transformer L1. Parallel to the primary winding of L1 are connected diodes $D_1$ and $D_2$. The second side of primary winding of this transformer is connected through resistor R10 to positive power supply. The emitter electrode of transistor Q4 is connected to a negative power supply (ground). The alternating current through the primary winding of transformer L1 induces a voltage of the same frequency in the secondary winding of same.

One side of the secondary winding is connected to ground, the second side being connected to a series resonating circuit consisting of a capacitor C8 and transformer L2. This circuit is tuned to a predetermined frequency, preferably between 20 to 50 kHz.

The output alternating voltage is then fed via resistor R11 to a diode rectifier D3. A voltage of negative polarity is supplied via diode D3 to capacitor C9 which is connected to the output of inverter G1. Under the receiving condition of the predetermined frequency, capacitor C9 is relatively slowly charged with a negative charge. When the voltage on C9 reaches a value which generates a current through R12 approximately equal to the current in R13, the transistor Q5 starts to cease conduction between its collector and emitter electrodes. This initiates a change in the input conditions of inverter G1. The output of G1 (prior high) starts to change to low. This change is coupled through C9 to R12 and via R12 to base electrode of Q5. This feedback speeds up the change from high to low output level of G1 and inhibits the undersirable initiation of a pulse for the time determined by a time constant of circuit consisting of C9, R12, R13. The inhibiting period is important to guarantee proper operation of the control function. Furthermore, the output of G1 is connected to the input of G2. The output of G2, in turn, is connected to input of G3, the output of which is connected via feedback capacitor C10 to the input of G2. Gate G2, G3 and capacitor C10 circuit configuration is used in speeding up the change (high to low or low to high) initiated by G1 as described above. The input of G4 is connected to the output of G3. Gate G4 is used as an isolating, decoupling and final pulse shaping stage.

The circuitry as described above is required to obtain a control clock pulse suitable for the FLIP FLOP (G5) which must have a very short rise and fall time.

The output of G5 is connected to the base electrode Q6. The collector electrode of Q6 is connected to a negative voltage supply. Emitter electrode of Q6 is connected via resistor R16 to the gate electrode of a switch S1 which is of TRIAC type. The TRIAC (S1) is employed as a solid state power AC switch which switches ON or OFF the output current supplied to the connected appliance.

The system operates as follows. Assuming that the receiver is energized and the solid state switch is OFF (G5 output low), during the transmission of the predetermined frequency which is processed through the above microphone and amplifier, a change of condition in the transistor Q5 is initiated. The change is processed through the gate G1, G2, G3 and G4. By doing so, a proper clock pulse for G5 has been generated. The output of G5 changes its state from low to high and this change is fed via Q6 to said switch S1 which now switches on.

After the transmission ceases and/or after the time constant of said circuit consisting of the capacitor C9 and resistors R12 and R13 is up, the input conditions of said transistor Q5 return to normal (transistor Q5 conducting). The remote control system is now ready to receive a subsequent commanding signal. The signal processing in the disclosed circuitry is now identical except the output of the gate G5 which now changes its state from high to low.

It will be appreciated that the portion of the above disclosed circuitry containing C2 through Q4 can also be referred to as amplifier means for amplifying said alternating electrical voltage. The portion including R10 and diodes D1 and D2 can also be referred to as amplitude limiting means operatively connected to the amplifier means. The transformer L1 can also be referred to as impedance transformation means connected to the amplitude limiting means, while the group consisting of capacitor C8 and transformer L2 can be referred to as frequency selecting means for selecting a predetermined frequency of said alternating electrical voltage. The circuitry containing the elements of resistor R11 through resistor R16 as described above constitutes, in general terms, switch actuating means while the switch S1 is the preferable embodiment of switch means.

It will be appreciated that the group consisting of the resistor R11 and diode D3 as described above can also be referred to as voltage rectifying means. The circuitry including resistors R12 and R13, capacitor C9, transistor Q5 and gate G1 can also be referred to as voltage level detecting means. R12, R13, Q5, G1 and C9 also act as pulse generating means and means for inhibiting undesired pulse generation.

The circuit comprising transistor Q6 and resistor R16 is one embodiment of the switch actuating current amplifying means.

It will be appreciated that the present invention has been disclosed by way of preferred embodiment and that various modifications to the preferred embodiment can be effected by those skilled in the art without departing from the scope of the present invention. For instance, the switch actuating current amplifying means can be omitted if the switch S is replaced by a relay. Similarly, those skilled in the art will appreciate that the means for inhibiting undersired pulse generation can be disposed in a manner different from that of FIG. 3.

The embodiments of the invention in which an exclusive property or privilege is claimed are defined as follows:

1. A remote control system including a remote control receiver responsive to a predetermined sonic frequency wherein the receiver is disposed inside a housing, the surface of said housing being provided with plug means suitable for being plugged into a regular household power socket to hold said box substantially fixed with respect to said socket, the surface of said box means further comprising socket means of a type suitable for receiving a regular household appliance power cord plug, whereby said receiver can be operatively connected with an appliance in a position wherein the receiver is located between the power inlet cord of the appliance and its associated household power socket, the receiver comprising:
   a. sound receiving means for conversion of sound waves into alternating electrical voltage;
   b. amplifier means connected to the sound receiving means for amplifying said alternating electrical voltage;
   c. amplitude limiting means operatively connected to said amplifier means;
   d. impedance transformation means connected to said amplitude limiting means;
   e. Frequency selecting means for selecting a predetermined frequency of said alternating electrical voltage connected to the impedance transformation means;
   f. switch actuating means including a flip-flop operated in response to the receipt of a signal of said predetermined frequency; and
   g. switch means connected to the switch actuating means.

2. Circuitry as claimed in claim 1 wherein said switch actuating means comprises the combination of
   h. voltage rectifying means for rectifying a signal passed by the frequency selecting means;
   i. voltage level detecting means connected to the voltage rectifying means;
   j. pulse generating means operated in response to the detection of a rectified signal exceeding a predetermined voltage by the voltage level detecting means,
   k. pulse waveform shaping means connected to the pulse generating means; and
   m. said flip-flop connected to said shaping means.

3. Circuitry as claimed in claim 2 including means for inhibiting undesired pulse generation connected between said pulse generating means and said pulse waveform shaping means.

4. circuitry as claimed in claim 2 including means for inhibiting undesired pulse generation connected between said pulse waveform shaping means and said flip-flop.

5. Circuitry as claimed in claim 2 including means for inhibiting undesired pulse generation connected between said voltage rectifying means and said voltage level detecting means.

6. Circuitry as claimed in claim 2 including means for inhibiting undesired pulse generation connected between said voltage rectifying means and said frequency selecting means.

7. circuitry as claimed in claim 2 including a switch actuating current amplifying means connected between said flip-flop and said switch means.

8. Circuitry as claimed in claim 7 including means for inhibiting undesired pulse generation connected between said pulse generating means and said pulse waveform shaping means.

9. Circuitry as claimed in claim 7 including means for inhibiting undesired pulse generation connected between said pulse waveform shaping means and said flip-flop.

10. Circuitry as claimed in claim 7 including means for inhibiting undesired pulse generation connected between said voltage rectifying means and said voltage level detecting means.

11. Circuitry as claimed in claim 7 including means for inhibiting undesired pulse generation connected between said voltage rectifying means and said frequency selecting means.

* * * * *